United States Patent [19]
Koide et al.

[11] Patent Number: 5,561,074
[45] Date of Patent: Oct. 1, 1996

[54] METHOD FOR FABRICATING REVERSE-STAGGERED THIN-FILM TRANSISTOR

[75] Inventors: Shin Koide; Susumu Ohi, both of Tokyo, Japan

[73] Assignee: NEC Corporation, Tokyo, Japan

[21] Appl. No.: 425,806

[22] Filed: Apr. 20, 1995

[30] Foreign Application Priority Data

Apr. 22, 1994 [JP] Japan ................................. 6-084229

[51] Int. Cl.$^6$ ......................... H01L 21/336; H01L 21/20
[52] U.S. Cl. ............... 437/40; 437/101; 437/233
[58] Field of Search ................................. 437/40, 101, 45, 437/40 TFI, 40 TFT, 233; 257/50, 60, 61

[56] References Cited

U.S. PATENT DOCUMENTS

| | | | |
|---|---|---|---|
| 4,882,295 | 11/1989 | Czubatyj et al. | 437/101 |
| 4,916,090 | 4/1990 | Motai et al. | 437/141 |
| 5,053,354 | 10/1991 | Tanaka et al. | 437/101 |
| 5,114,869 | 5/1992 | Tanaka et al. | 437/40 |
| 5,124,272 | 6/1992 | Saito et al. | 437/41 |
| 5,270,224 | 12/1993 | Furumura et al. | 437/31 |
| 5,340,758 | 8/1994 | Wei et al. | 437/40 |

FOREIGN PATENT DOCUMENTS

| | | |
|---|---|---|
| 61-237420 | 10/1986 | Japan . |
| 2-163972 | 6/1990 | Japan . |
| 4-321275 | 11/1992 | Japan . |
| 4-367277 | 12/1992 | Japan . |
| 4-367276 | 12/1992 | Japan . |
| 5-83197 | 11/1993 | Japan . |

*Primary Examiner*—T. N. Quach
*Attorney, Agent, or Firm*—Sughrue, Mion, Zinn, Macpeak & Seas

[57] ABSTRACT

A method for a thin-film transistor employed as a liquid crystal display includes the steps of selectively forming a gate electrode on a substrate, covering the gate electrode and the substrate with a gate insulating film, forming a semiconductor channel layer on the gate insulating film, forming on the channel layer a semiconductor contact layer of a first conductivity type having first, second and third portions, forming source and drain electrodes respectively on the first and second portions of the contact layer, removing the third portion of the contact layer to expose a part of the channel layer, and forming a semiconductor region of a second conductivity type at the part of the channel layer.

12 Claims, 3 Drawing Sheets

METHOD FOR FABRICATING REVERSE-STAGGERED THIN-FILM TRANSISTOR

BACKGROUND OF THE INVENTION

1. Field of the Invention

The present invention relates to a method for fabricating a thin-film transistor and, more particularly, to a method for fabricating a reverse-staggered thin-film transistor employed in a liquid crystal display device.

2. Description of the Prior Art

FIG. 1 shows a conventional thin-film transistor of an amorphous silicon. This thin-film transistor is constituted by a gate electrode 2, a gate insulating film 3 made of a silicon nitride film, an intrinsic amorphous silicon layer 4 and an n-type amorphous silicon contact layer 5, a drain electrode 6, a source electrode 7. A protective layer 9 made of silicon nitride is further formed to cover the transistor. In this structure, the surface portion 10 of the amorphous silicon layer 4 between the drain electrode 6 and the source electrode 7 is sometimes called a "back channel" and has one of key factors determining the characteristics of the transistor.

Specifically, if back channel 10 is contaminated and thus charged prior to the formation of the protective film 9, a leak current is caused to increase and flows between the source and drain. Even if the back channel 10 is not contaminated, the positive electric charges due to the contamination on the protective film 9 increase an electric field applied the back channel 10 up to or more than the threshold of the back channel. A leakage current thereby flows. In addition, the protective film 9 itself may be positively charged, so that the leak current also flows.

In order to overcome such a problem, a thin-film transistor is disclosed in Japanese Patent Laid-Open No. Hei 2-163972 that has a back channel covered with an oxide film obtained from hydrogen peroxide or with an alumina film formed by the CVD process. Such a film can convert the back channel into a p-type one. The leakage current is thereby decreased.

However, the p-type back channel thus converted depends on the quality of the oxide or the alumina film and is thus inferior in controllability. Moreover, when hydrogen peroxide is used, the drain and source electrodes are damaged by the hydrogen peroxide. In the case of the alumina film, on the other hand, alumina in the alumina film may be diffused into the amorphous silicon layer to change the property of a thin-film transistor.

Another thin-film transistor is disclosed in Japanese Patent Laid-Open No. Hei 4-321275 to reduce the leakage current. In this transistor, an aluminum oxide layer is formed on a back channel. For this reason, this transistor also has the same problems as mentioned above.

Turning to FIG. 2, there is shown another thin-film transistor which is disclosed in Japanese Patent Publication No. Hei 5-0083197, in which the same constituents as those shown in FIG. 4 are denoted by the same reference numerals. In this device, a portion of the n-type contact layer 5 which is not covered with the drain and source electrodes 6 and 7 is converted into a p-type region 11 by adding p-type impurities therein. The back channel is thereby covered with the p-type region 11.

However, the contact layer 5 has a considerably high impurity concentration of $10^{20}$ atoms/cm$^3$ or more. For this reason, it is necessary to dope the p-type impurities at a very high concentration. Such very high doping lacks in controllability, however. Moreover, the very highly doped region 11 results in increase of the leakage current.

SUMMARY OF THE INVENTION

It is therefore an object of the present invention to provide a method for fabricating a thin-film transistor of a low leakage current without deteriorating the characteristics of the transistor.

It is another object of the present invention to provide a method for fabricating a thin-film transistor having a low leakage current by a simplified process.

According to the thin-film transistor fabrication method of the present invention, it is possible to provide a structure in which a p-type amorphous silicon layer or a p-type polysilicon layer is formed uniformly on an intrinsic amorphous silicon layer directly.

Therefore, the method has an advantage of preventing the leak current of a transistor which is increased due to contamination by cations coming from the outside and electron generation in a back channel by electrification of the protective film. Moreover, because p-type amorphous silicon or p-type polysilicon can selectively be deposited on amorphous or polysilicon by exposing it to the gaseous phase of disilane containing diborane or silane, and there is no such side reaction as effected wiring, aluminum diffusion in an amorphous or polysilicon layer, or difficult process control, and a large advantage can be obtained. When using the plasma CVD process, there is an advantage that the film forming rate is high though the selectivity is low.

Furthermore, there is an advantage that a high reliability is obtained because a p-type silicon layer directly contacts an amorphous or polysilicon layer and a silicon-nitride protective film and a stable interface is obtained.

The method of the present invention for fabricating a thin-film transistor is characterized in that a p-type amorphous silicon layer with a thickness of 100Å or less containing no n-type doped impurities is formed on a back channel of the intrinsic amorphous silicon directly. Because of the absence n-type doped impurities, impurity density of the p-type amorphous silicon layer is not so high that prevents current leakage according to non-uniform ion distribution of the layer. Furthermore, it gets more uniformal ion distribution according to obtaining by gaseous phase of disilane or silane gas containing diborane. Moreover, the method of the present invention is characterized in that the p-type amorphous silicon layer can be obtained by exposing the intrinsic amorphous silicon layer to the gaseous phase of disilane or silane gas containing diborane. Furthermore, it is possible to use polysilicon instead of amorphous silicon.

BRIEF DESCRIPTION OF THE DRAWINGS

The above-mentioned and other objects, features, and advantages of the present invention will become more apparent from the following detailed description when taken in conjunction with the accompanying drawings, wherein.

DESCRIPTION OF THE PREFERRED EMBODIMENTS

Figure 1:
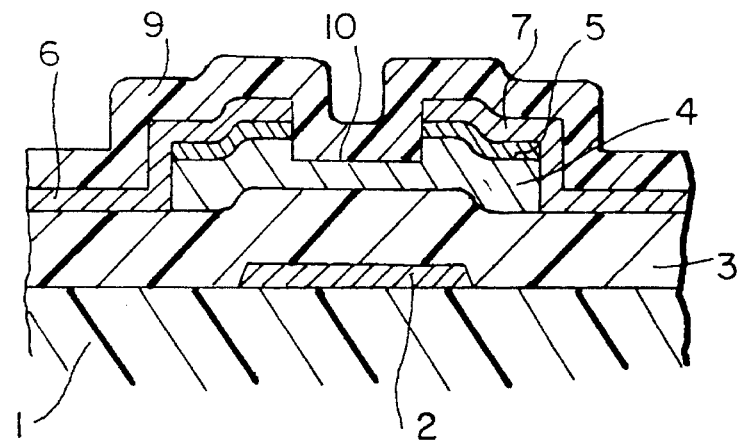
FIG. 1 is a sectional view of a thin-film transistor according to a prior art.
Figure 2:
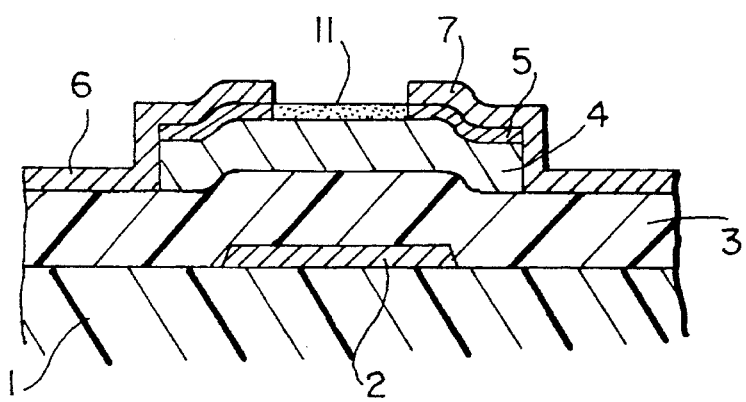
FIG. 2 is a sectional view of a thin-film transistor according to another prior art.
Figure 3:
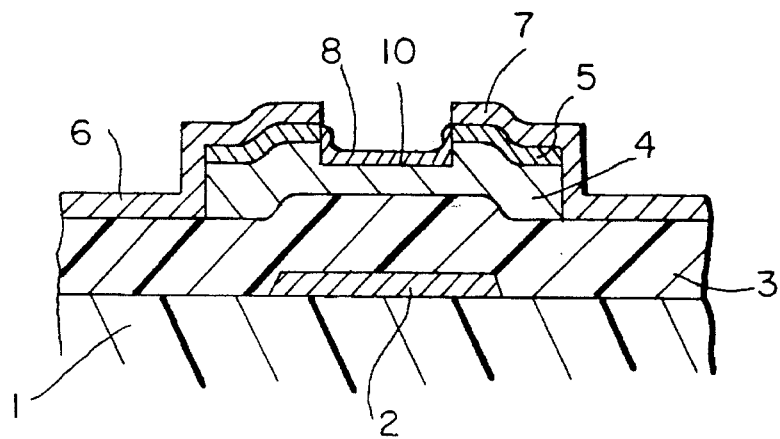
FIG. 3 is a sectional view illustrative of a thin-film transistor fabricated by a method according to an embodiment of the present invention.

Referring now to FIG. 3, a thin-film transistor fabricated by a method according an embodiment of the present invention has a gate electrode 2 selectively formed on an insulating substrate 1. The transistor further comprises a gate insulating film 3, an intrinsic or non-doped amorphous silicon layer 4, an n-type amorphous silicon contact layer 5, a drain electrode 6, and a source electrode 7. This transistor further has a p-type amorphous silicon layer 8 on the back channel portion of the amorphous silicon layer 4 between the drain electrode 6 and the source electrode 7 in accordance with the present invention. The thickness of p-type amorphous silicon layer 8 is 100Å or less. A protective material such as silicon-nitride covers the p-type amorphous silicon layer 4 and a the source and drain electrodes 6 and 7 in contact therewith.

Turning to FIG. 4, the above thin-film transistor is fabricated as follows:

First, as shown in FIG. 4 (a), the gate electrode 2 made of a metal such as chromium is selectively formed on the insulating substrate 1 made of a glass or the like, followed by forming the gate insulating film 3 made of silicon nitride over the entire surface. The intrinsic or non-doped amorphous silicon layer 4 and the n-type amorphous silicon contact layer 5 are thereafter deposited in that order by the plasma CVD method.

Then, the amorphous silicon layer 4 and the n-type amorphous silicon contact layer 5 are selectively etched to form an island by the lithography art, as shown in FIG. 4 (b). Subsequently, a metal film made of chromium or the like is deposited over the entire surface by the sputtering method and then patterned to form the drain electrode 6 and the source electrode 7 as shown in FIG. 4 (c).

Thereafter, the portion of the n-type amorphous silicon contact layer 5 between the drain electrode 6 and the source electrode 7 is removed by using the electrodes as a mask by the wet etching method or the dry etching method in accordance with the present invention. This etching process is carried out until the surface portion of the amorphous silicon layer 4 is exposed. That portion of the contact layer 5 is thus completely removed, the surface of the amorphous silicon layer 4 thus exposed serves as a back channel 10, as shown in FIG. 4(d).

Turning back to FIG. 3, the p-type amorphous silicon layer 8 is then selectively deposited between the drain electrode 6 and the source electrode 7 in accordance with the present invention. Finally the silicon-nitride protective film 9 is formed.

Figure 4A:
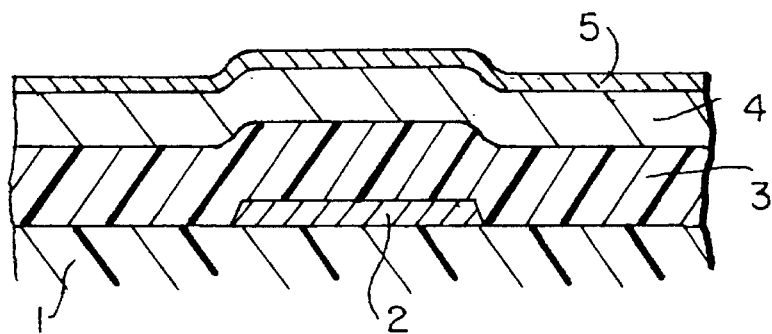
FIGS. 4(a) to 4(d) are sectional views illustrative of respective steps of a method according to the embodiment of the present invention.
Figure 4B:
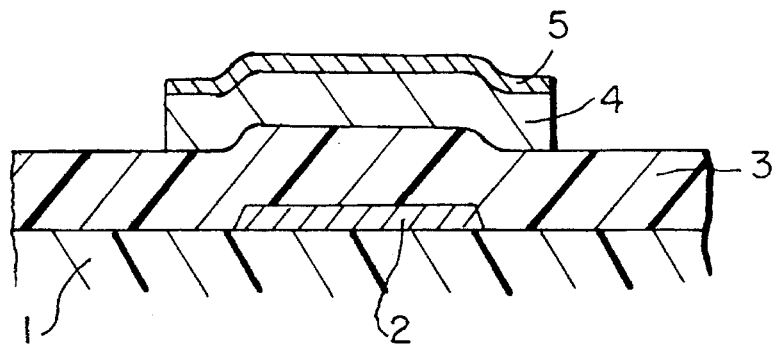
Figure 4C:
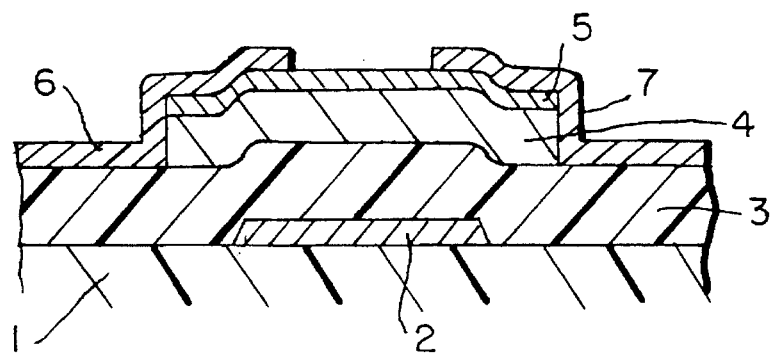
Figure 4D:
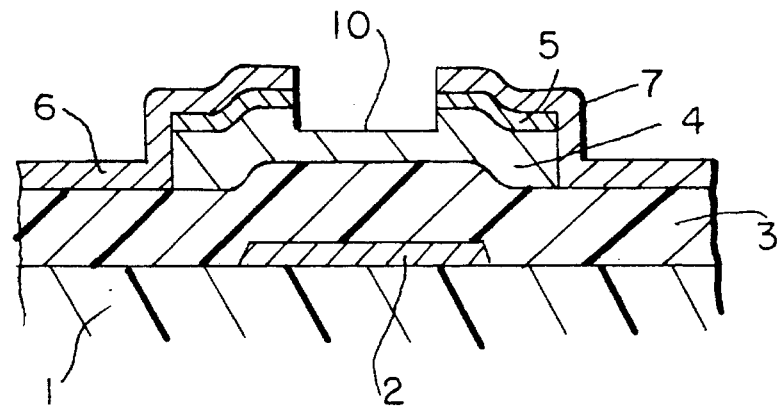

The selective deposition of the p-type amorphous silicon layer 8 only on the exposed amorphous silicon layer is performed by mixing disilane $Si_2H_6$, hydrogen $H_2$ and diborane $B_2H_6$ at the ratio of 3:2:6, setting the pressure of the mixed gas to 200 Pa and the substrate temperature to 350° C., and exposing the thin-film transistor shown in FIG. 4(d) to the mixed-gas atmosphere. The thickness of the layer 8 is several tens of angstroms though it cannot accurately be measured because the deposition rate is very low. Under the above conditions, the depositing time for the layer 8 can be approx. 15 min. Thereafter, the layer 8 is annealed in the nitrogen atmosphere at 250° C. for 30 min.

In the case of the above vapor-phase epitaxy, it is possible to use silane instead of disilane in the mixed gas. However, silane is not easily decomposed only by raising the temperature. Therefore, it is better to use disilane. The ratio of disilane $Si_2H_6$ to diborane $B_2H_6$ of the mixed gas is set to 1:2. The ratio of hydrogen gas can be changed within the range of 0 to 10 when the ratio of disilane as 1. Moreover, it is possible to add an inert gas such as argon to the mixed gas in order to adjust the pressure of the mixed gas.

It is possible to properly change the temperature of the substrate in the range of 300° to 400° C. However, when the temperature goes out of the range, it is difficult to perform the vapor-phase epitaxy. Because it is enough to deposit a p-type amorphous silicon layer up to the thickness of 10 to 100Å in a vapor phase, the layer can be deposited for 10 to 30 min. If the layer is too thick, there is a problem that leak current may flow. If the layer is too thin, it can not be formed uniformly. The annealing time is approximately 30 min to 2 hr.

Because the p-type amorphous silicon layer 8 is obtained at a very low deposition rate, it is easily influenced by a substrate due to the same effect as the epitaxial art for single-crystal silicon and thus it is selectively deposited only on the intrinsic amorphous silicon layer 4. Therefore, the layer 8 is preferable because it is hardly deposited on areas of the substrate other than the intrinsic amorphous silicon layer 4. Presence of the p-type amorphous silicon layer 8 can be confirmed by measuring the depth profile through the SIMS element analysis and it is found that boron is present in layers with a thickness of 50Å or less at a concentration of $10^{18}$ to $10^{19}$ atoms/cm$^3$.

Figure 5:
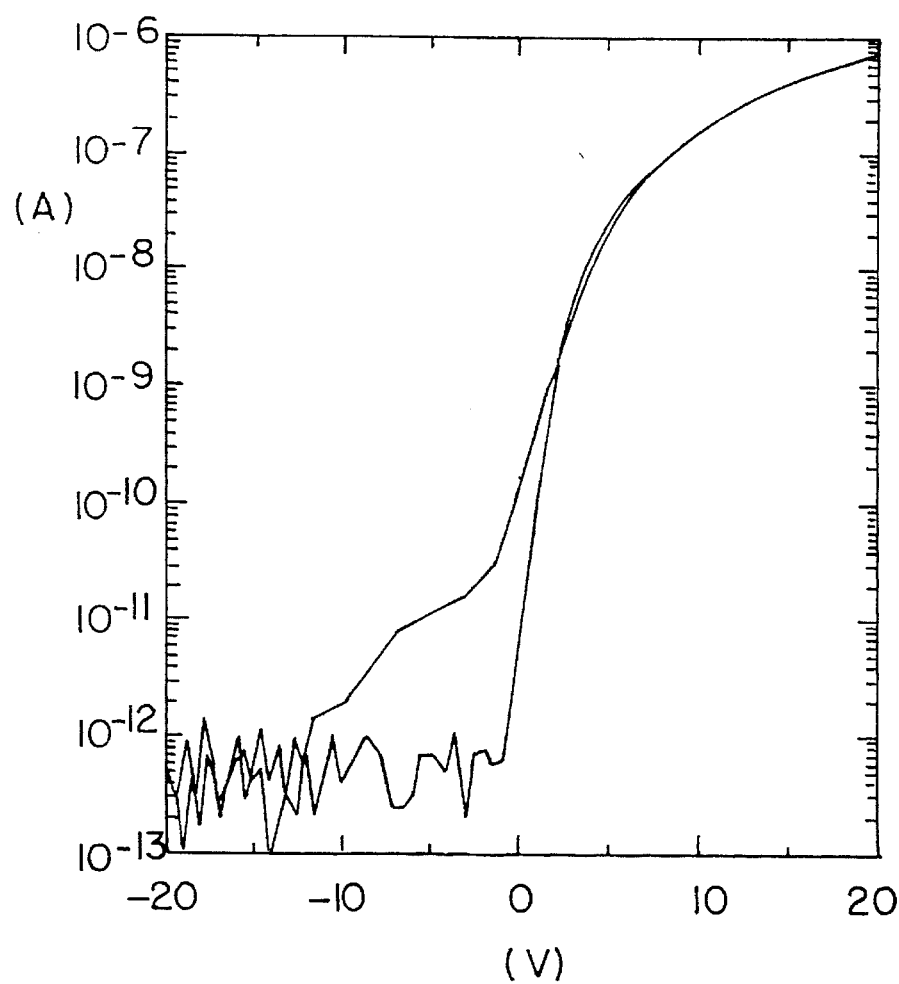
FIG. 5 is a graph indicative of comparison in a source-drain current between the thin-film transistor shown in FIG. 1 and that shown in FIG. 1 or FIG. 2.

FIG. 5 shows the property of the thin-film transistor of this embodiment. In particular, there is shown the current between drain and source to the gate voltage when applying the voltage of 10 V between the drain and source. From FIG. 5, it is understood that the current between the drain and the source is decreased for the gate voltage of −10 v to 0 V compared to the case of the prior art. That is, the leak current is decreased when the thin-film transistor is off. Moreover, in this embodiment, increase of the off current is not recognized even by applying +30 V to the gate electrode and 0 V to the source electrode for 90 min in an air temperature of 80° C. This is because the p-type silicon layer directly contacts the silicon-nitride protective film 9 and a stable interface is formed.

It is also possible to form a p-type amorphous silicon layer by using the plasma CVD process as another means. When using the plasma CVD process, the p-type amorphous silicon layer 8 with a thickness of several tens of angstroms is formed by mixing silane $SiH_4$, hydrogen $H_2$, and diborane $B_2H_6$ at a mixing ratio of 1:1:2, setting the pressure of the mixed gas to 0.75 Torr, the substrate temperature to 300° C., and the electric power to 25 mW/cm$^2$, and discharging electricity for 10 sec. When using the plasma CVD process, an advantage is obtained that a p-type amorphous silicon layer can be formed for several tens of seconds though the selectivity is low. It is previously described that it is preferable to use disilane and diborane for the vapor-phase epitaxy process. In the case of plasma CVD, however, it is better to use silane and diborane. Of course, it is possible to use disilane for the plasma CVD. However, because disilane is more easily decomposed than silane and therefore it is extremely decomposed due to plasma, disilane is less suitable for the plasma CVD. In the case of the plasma CVD, plasma serves as an assistant to decompose silane. Therefore, the combination of disilane and diborane in the vapor-phase epitaxy process corresponds to the combination of silane and diborane in the plasma CVD process.

The mixing ratio of silane $SiH_4$ to diborane $B_2H_6$ is set to 1:2 and hydrogen $H_2$ is mixed with the mixture of them in the range of 0 to 5. The pressure, substrate temperature, and electric power can be changed in the ranges of 80 to 120 Pa, 250° to 320° C., and 10 to 30 mW/cm$^2$ respectively. It is necessary to set the discharge time to several seconds to 1 min.

Figure 6:
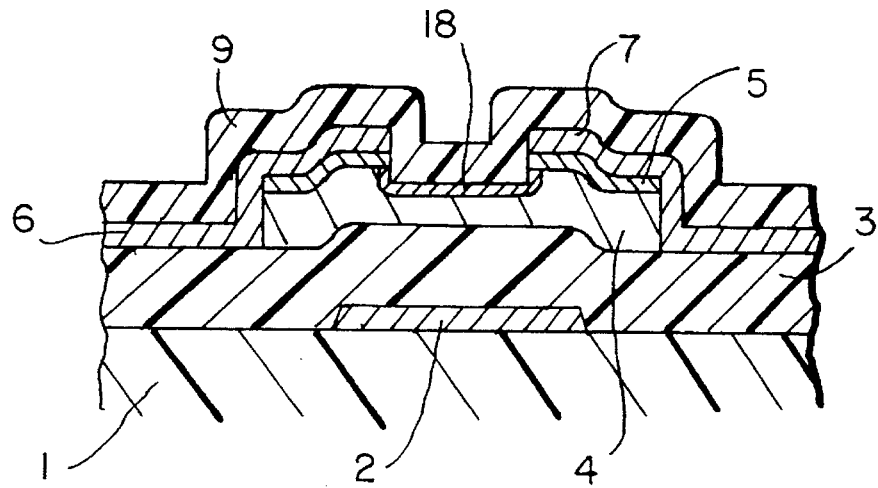
FIG. 6 is a sectional view illustrative of a thin-film transistor fabricated by a method according to another embodiment of the present invention.

Referring to FIG. 6, there is shown a thin-film transistor fabricated by a method according to another embodiment of the present invention, in which the same constituents as those shown in FIGS. 3 and 4 are denoted by the same reference numerals to omit the further description thereof. In this embodiment, a p-type layer is denoted by the reference numeral 18 and thus formed by implanting or diffusing p-type impurities into the back channel portion of the layer 4. That is, after the step as shown in FIG. 4(d), boron ions are implanted by using the drain and source electrodes 6 and 7 as a mask. The annealing is then carried out to thereby form the p-type layer 18.

The above embodiment shows a case of using amorphous silicon. However, it is also possible to use a thin-film transistor made of polysilicon instead of amorphous silicon. Even if polysilicon is used, the p-type polysilicon fabrication method is completely the same as the case of amorphous silicon described above.

It is apparent that the present invention may be modified and changed without departing from the scope and spirit of the invention.

What is claimed is:

1. A method for fabricating a reverse-staggered type thin-film transistor comprising the steps of:

forming a gate electrode on a substrate;

forming a gate insulating film on said gate electrode and said substrate;

forming an intrinsic semiconductor channel layer on said gate insulating film;

forming a semiconductor contact layer of a first conductivity type on said intrinsic semiconductor channel layer;

forming a source electrode and a drain electrode on said semiconductor contact layer;

selectively removing said semiconductor contact layer between said source and drain electrodes to expose a part of said intrinsic semiconductor channel layer; and selectively depositing a semiconductor layer of a second conductivity type on a top surface of said exposed part of said intrinsic semiconductor channel layer.

2. The method as claimed in claim 1, further comprising the step of forming a silicon-nitride protective film on said semiconductor layer.

3. The method as claimed in claim 1, wherein said semiconductor layer is deposited by using a plasma CVD method.

4. The method as claimed in claim 1, wherein said semiconductor layer is deposited by using a vapor-phase epitaxy method.

5. The method as claimed in claim 4, wherein said vapor-phase epitaxy method uses a mixed gas comprising at least two of $Si_2H_6$, $H_2$ and $B_2H_6$.

6. The method as claimed in claim 3, wherein said plasma CVD method uses a mixed gas comprising at least two of $SiH_4$, $H_2$ and $B_2H_6$.

7. The method as claimed in claim 6, wherein a ratio of $SiH_4$ to $B_2H_6$ in said mixed gas is substantially set to 1:2.

8. The method as claimed in claim 5, wherein a ratio of $Si_2H_6$ to $B_2H_6$ in said mixed gas is substantially set to 1:2.

9. A method for fabricating a reverse-staggered type thin-film transistor comprising the steps of:

forming a gate electrode on a substrate;

forming a gate insulating film on said gate electrode and said substrate;

forming an intrinsic semiconductor channel layer on said gate insulating film;

forming a semiconductor contact layer of a first conductivity type on said intrinsic semiconductor channel layer;

forming a source electrode and a drain electrode on said semiconductor contact layer;

selectively removing said semiconductor contact layer between said source and drain electrode to expose a part of said intrinsic semiconductor channel layer, selectively depositing a semiconductor layer of a second conductivity type on a top surface of said exposed part of said intrinsic semiconductor channel layer by using a vapor phase epitaxy method; and forming a silicon-nitride protective film on said semiconductor layer.

10. The method as claimed in claim 9, wherein said vapor-phase epitaxy method uses a mixed gas comprising at least two of $Si_2H_6$, $H_2$ and $B_2H_6$.

11. The method as claimed in claim 9, wherein a ratio of $Si_2H_6$ to $B_2H_6$ in said mixed gas is substantially set to 1:2.

12. A method for fabricating a thin-film transistor comprising the steps of:

forming a gate electrode on a substrate;

forming a gate insulating film on said gate electrode and said substrate;

forming a semiconductor channel layer on said gate insulating film;

forming a semiconductor contact layer of a first conductivity type on said semiconductor channel layer;

forming a source electrode and a drain electrode on said semiconductor contact layer;

selectively removing said semiconductor contact layer between said source and drain electrodes to expose a part of said semiconductor channel layer; and selectively depositing a semiconductor layer of a second conductivity type on a top surface of said exposed part of said semiconductor channel layer.

* * * * *